United States Patent
Schicktanz et al.

(10) Patent No.: US 9,240,434 B2
(45) Date of Patent: Jan. 19, 2016

(54) ORGANIC LIGHT-EMITTING DIODE AND DEVICE COMPRISING AN ORGANIC LIGHT-EMITTING DIODE

(71) Applicant: OSRAM Opto Semiconductors GmbH, Regensburg (DE)

(72) Inventors: Simon Schicktanz, Regensburg (DE); Egbert Höfling, Regensburg (DE); Erwin Lang, Regensburg (DE); Benjamin Claus Krummacher, Regensburg (DE); Karsten Diekmann, Rattenberg (DE)

(73) Assignee: OSRAM OLEDGmbH, Regensburg (DE)

( * ) Notice: Subject to any disclaimer, the term of this patent is extended or adjusted under 35 U.S.C. 154(b) by 0 days.

(21) Appl. No.: 14/377,401

(22) PCT Filed: Dec. 5, 2012

(86) PCT No.: PCT/EP2012/074474
§ 371 (c)(1),
(2) Date: Aug. 7, 2014

(87) PCT Pub. No.: WO2013/117267
PCT Pub. Date: Aug. 15, 2013

(65) Prior Publication Data
US 2015/0091435 A1 Apr. 2, 2015

(30) Foreign Application Priority Data
Feb. 7, 2012 (DE) .......................... 10 2012 201 801

(51) Int. Cl.
*H01L 51/50* (2006.01)
*H01L 51/52* (2006.01)
*H01L 27/32* (2006.01)

(52) U.S. Cl.
CPC ............ *H01L 27/32* (2013.01); *H01L 27/3223* (2013.01); *H01L 51/5203* (2013.01)

(58) Field of Classification Search
CPC . H01L 27/28–27/32; H01L 51/5203–51/5234; H01L 27/3223
See application file for complete search history.

(56) References Cited

U.S. PATENT DOCUMENTS 6,060,770 A * 5/2000 Nakamura ........ H01L 23/49572
257/666
7,348,605 B2 * 3/2008 Park ......................... H01L 27/12
257/99

(Continued)

FOREIGN PATENT DOCUMENTS

DE 102008027519 A1 12/2009
DE 102010064231 A1 7/2011

(Continued)

*Primary Examiner* — Mariceli Santiago
(74) *Attorney, Agent, or Firm* — Slater & Matsil, L.L.P.

(57) ABSTRACT

In at least one embodiment, a light-emitting diode includes a carrier and an organic layer sequence with an active layer. A mirror layer and electrical contact regions are located on a connection side of the carrier. The contact regions are provided for electrically contacting the organic layer sequence. Electrical dummy regions are located on the connection side. The dummy regions are electrically insulated from the contact regions. The mirror layer is present in the dummy regions and in the contact regions. At least two of the dummy regions are arranged in such a way that base areas of these dummy regions cannot be congruently superimposed merely by arbitrary rotation of the carrier relative to a center axis of the carrier perpendicular to the connection side.

20 Claims, 2 Drawing Sheets

(56) References Cited

U.S. PATENT DOCUMENTS

| | | | |
|---|---|---|---|
| 8,519,424 B2 * | 8/2013 | Hammond | G09F 9/33 257/99 |
| 8,748,914 B2 * | 6/2014 | Kang | H01L 51/5246 257/40 |
| 2002/0068191 A1 * | 6/2002 | Kobayashi | H01L 51/5237 428/690 |
| 2009/0302729 A1 | 12/2009 | Amelung et al. | |
| 2009/0302760 A1 | 12/2009 | Tchakarov et al. | |
| 2011/0156084 A1 | 6/2011 | Choi et al. | |
| 2014/0110865 A1 | 4/2014 | Ng et al. | |
| 2015/0211718 A1 * | 7/2015 | Diekmann | H05K 1/118 362/382 |

FOREIGN PATENT DOCUMENTS

| | | |
|---|---|---|
| DE | 102010014611 A1 | 10/2011 |
| DE | 102010014613 A1 | 10/2011 |
| DE | 102010029848 A1 | 1/2012 |
| DE | 102010032834 A1 | 2/2012 |
| EP | 1696706 A1 | 8/2006 |
| WO | 2007072275 A2 | 6/2007 |
| WO | 2008012460 A2 | 1/2008 |

* cited by examiner

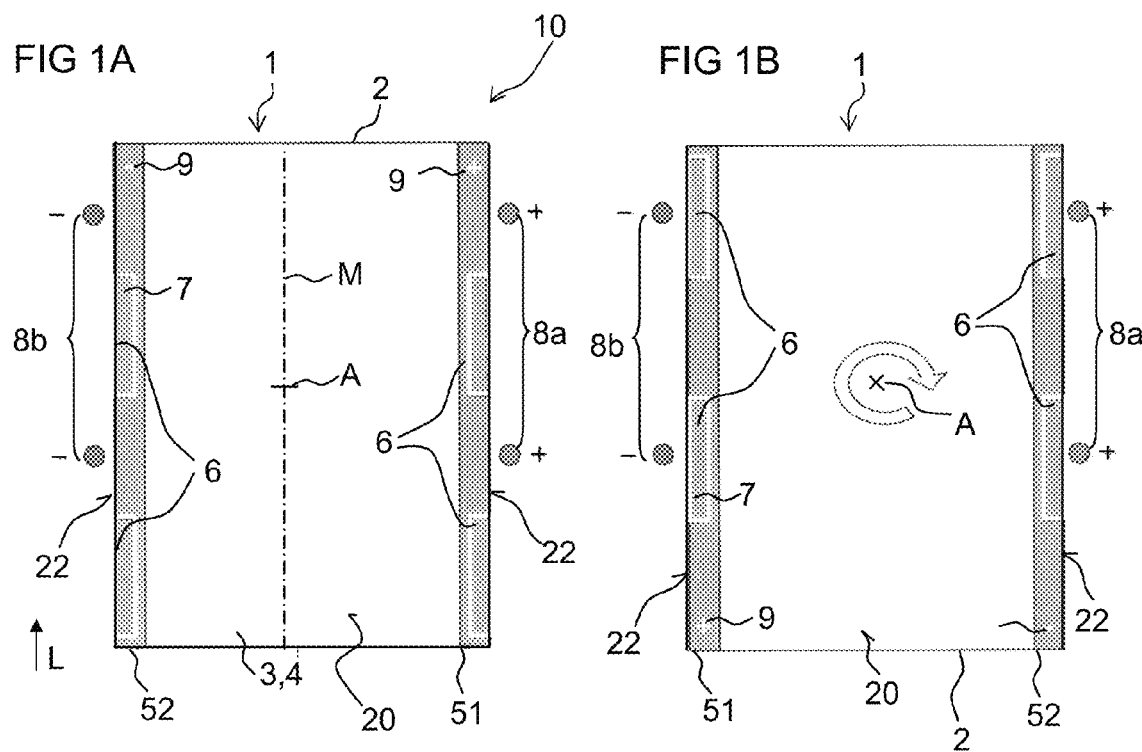
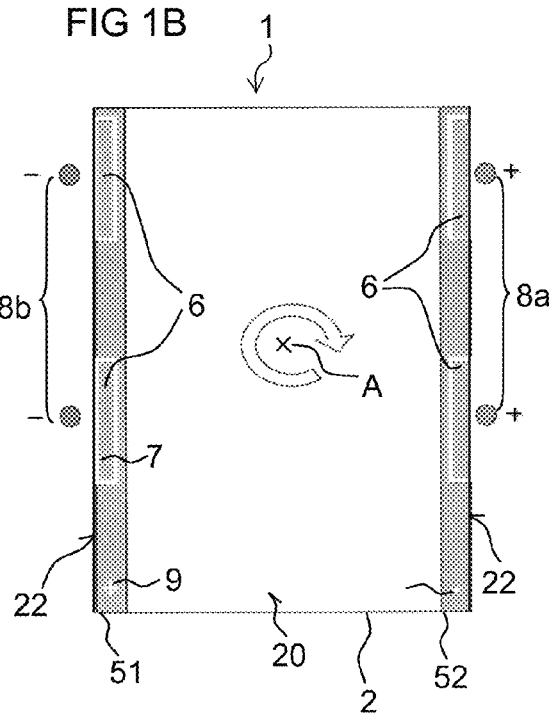
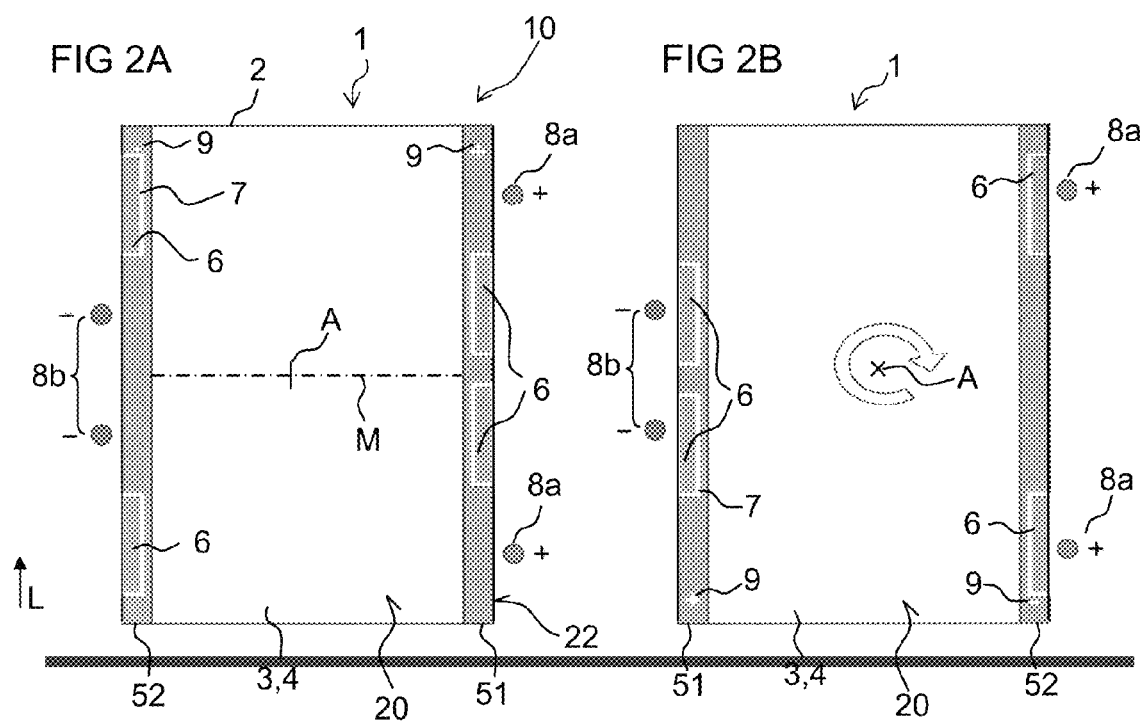
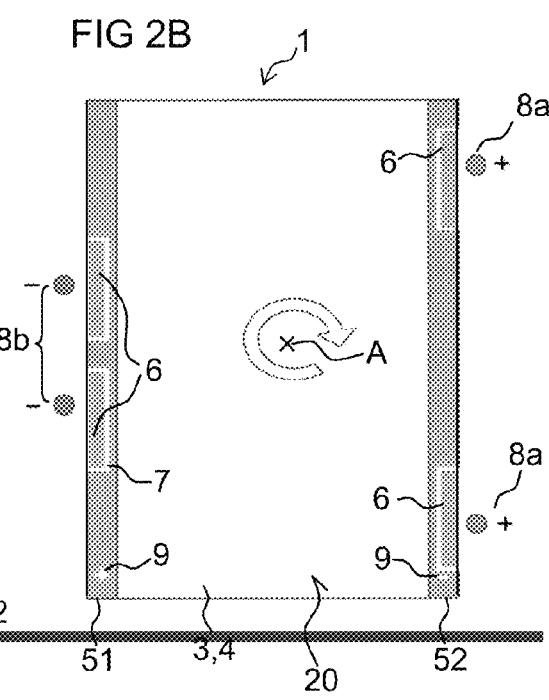

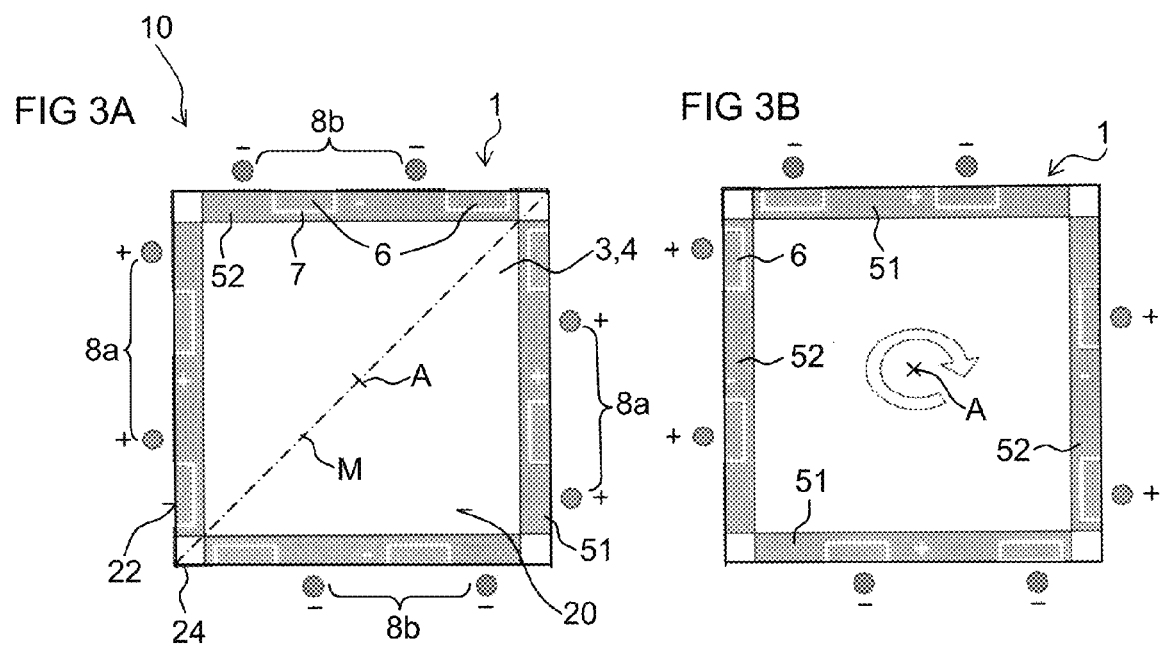
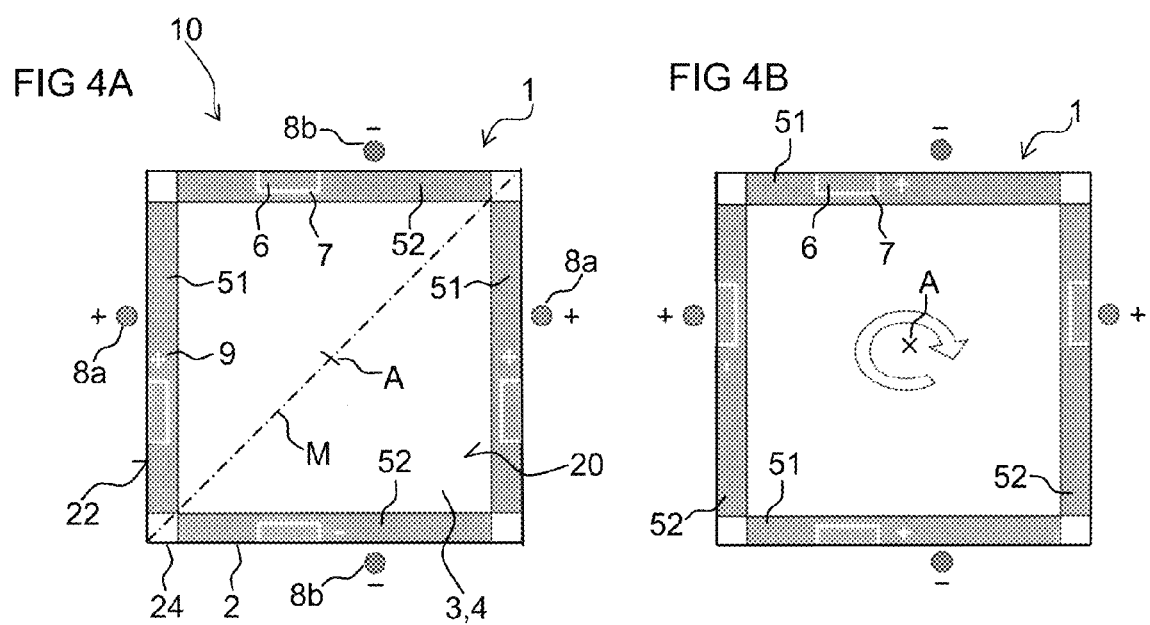

ORGANIC LIGHT-EMITTING DIODE AND DEVICE COMPRISING AN ORGANIC LIGHT-EMITTING DIODE

This patent application is a national phase filing under section 371 of PCT/EP2012/074474, filed Dec. 5, 2012, which claims the priority of German patent application 10 2012 201 801.8, filed Feb. 7, 2012, each of which is incorporated herein by reference in its entirety.

TECHNICAL FIELD

An organic light-emitting diode is provided. An apparatus with such a light-emitting diode is also provided.

SUMMARY

Embodiments of the invention provide an organic light-emitting diode comprising polarity reversal protection.

According to at least one embodiment, the organic light-emitting diode comprises a carrier. The carrier forms the component mechanically supporting and mechanically carrying the light-emitting diode. The carrier is preferably transmissive to radiation generated when the light-emitting diode is in operation. For example, the carrier is transparent or translucent. The carrier may in particular comprise a glass sheet, a glass film, a plastics sheet or a plastics film. Alternatively, the carrier may be opaque and preferably reflective. For example, the carrier then comprises a metal foil or a metal sheet or a ceramic.

According to at least one embodiment, the carrier comprises at least one, preferably precisely one connection side. The connection side is configured such that electrical contacting of the light-emitting diode proceeds indirectly or directly via the connection side.

According to at least one embodiment, the light-emitting diode contains one or more organic layer sequences. The organic layer sequence comprises at least one active layer, which is provided to generate radiation when the light-emitting diode is in operation. In particular, ultraviolet or visible radiation is generated in the active layer during operation. For example, when operating properly, the active layer emits at at least one wavelength in the spectral range between 440 nm and 680 nm inclusive.

According to at least one embodiment of the light-emitting diode, the latter comprises a mirror layer. The mirror layer is configured to reflect at least in part the radiation generated in the active layer. For example, the reflectivity of the mirror layer relative to the radiation generated in the active layer amounts to at least 30% or at least 50%, preferably at least 80% or at least 90%. The mirror layer may be a Bragg mirror or, preferably, a metal mirror. Elevated reflection may also be present due to a refractive index jump at a boundary surface. In particular, the mirror layer may be electrically conductive or comprise electrically conductive constituents.

According to at least one embodiment, the mirror layer is located on the connection side of the carrier. In particular, the mirror layer is located on the same side of the carrier as the organic layer sequence. It is possible for the organic layer sequence to be located partially or completely between the carrier and the mirror layer. It is additionally possible for an electrically insulating layer to be mounted between the mirror layer and the carrier, for example, at least in those subregions of the connection side in which no organic layer sequence has been applied.

According to at least one embodiment of the light-emitting diode, the latter comprises one or more first electrical contact regions and one or more second electrical contact regions. The organic light-emitting diode is electrically contactable via the electrical contact regions. For example, the first contact regions are connected electrically conductively to an anode side of the organic layer sequence and the second contact regions are connected to a cathode side of the organic layer sequence, or indeed vice versa.

According to at least one embodiment, the electrical contact regions are each located on the connection side of the carrier. The contact regions may be mounted indirectly or directly on the connection side.

According to at least one embodiment, the light-emitting diode comprises two or more electrical dummy regions. The dummy regions are located indirectly or directly on the connection side of the carrier. The dummy regions are electrically insulated from the contact regions. When the light-emitting diode is operated properly, there is thus no current flow from the dummy regions towards the contact regions or towards the organic layer sequence and vice versa.

According to at least one embodiment of the light-emitting diode, the mirror layer is present both in the dummy regions and in the contact regions. In particular, within the bounds of manufacturing tolerances the contact regions and the dummy regions have the same reflectivity for visible light and/or for the radiation generated in the organic layer sequence. Preferably, the organic light-emitting diode then produces the effect, when turned off, of a uniform, uninterrupted mirror surface.

According to at least one embodiment, one or more metallized layers, in particular metallized contact layers, are located on a side of the mirror layer remote from the carrier. Such metallized layers may, for example, comprise chromium, molybdenum, nickel, palladium and/or gold. It is possible for such metallized contact layers to be applied to one or two sides of the metallic mirror layer, which, for example, comprises silver and/or aluminum. For example, the layer sequence molybdenum-aluminum-molybdenum is present. Alternatively, it is possible for the metallized contact layers themselves to form the mirror layer. It is also possible for the electrical contact regions to be formed by a transparent conductive oxide such as ITO. In this case in particular it is possible for the mirror layer to reflect on the basis of total reflection and/or on the basis of a refractive index difference relative to an adjacent medium. Furthermore, the light-emitting diode may then emit radiation on two mutually opposing major sides when in operation.

According to at least one embodiment of the light-emitting diode, at least two of the dummy regions or all the dummy regions are arranged in such a way that base areas of these dummy regions cannot be congruently superimposed merely by arbitrary rotation of the carrier about a center axis. Rotation should here in particular be understood in the context of geometric mapping. The rotation thus comprises in particular self-mapping with an axis of rotation, wherein all the distances between pairs of points remain the same during mapping and an orientation is retained, such that rotatory reflection does not arise.

The axis of rotation is here preferably the center axis of the carrier. The center axis is oriented perpendicular to the connection side of the carrier. The center axis preferably passes through the geometric center point and/or the center of gravity of the carrier. Alternatively or in addition, it is possible for the center axis of the carrier to be located at a point of intersection of at least two diagonals of the carrier, when viewed in plan view onto the connection side.

In other words it is not possible structurally to produce the base areas of all the dummy regions from a base area of one specific dummy region merely by rotation about the center axis. Thus it is not possible to produce all the base areas of the dummy regions from one another merely by rotation.

In at least one embodiment of the light-emitting diode, the latter comprises a carrier with a connection side and an organic layer sequence with at least one active layer provided for radiation generation. On the connection side of the carrier there are located a mirror layer and at least one first electrical contact region and at least one second electrical contact region. The electrical contact regions are provided for electrical contacting of the organic layer sequence. In addition, on the connection side there are located at least two electrical dummy regions. The dummy regions are electrically insulated from the contact regions. The mirror layer is present both in the dummy regions and in the contact regions. At least two of the dummy regions are arranged in such a way that base areas of these dummy regions cannot be congruently superimposed merely by arbitrary rotation of the carrier relative to a center axis of the carrier perpendicular to the connection side.

If the light-emitting diode is connected the wrong way round to electrical contact pins, the dummy regions may result in these contact pins being in contact only with the dummy regions and not with the contact regions if the light-emitting diode is incorrectly oriented. This will prevent incorrect electrical connection of the light-emitting diode, i.e., with electrical polarity not properly provided.

According to at least one embodiment of the light-emitting diode, interruptions in the mirror layer and/or in the metallized contact layers are located in each case between the dummy regions and the contact regions. In other words there is then no continuous material connection in the mirror layer from the dummy regions to the contact regions. The interruption may surround the dummy regions in the manner of a frame, preferably at least on two sides of the dummy regions or on at least three sides or on at least four sides. The dummy regions may each be completely surrounded in the manner of a frame by the interruption and/or by the metallized contact layer and/or by the contact region.

According to at least one embodiment, the interruption has an average width of at most 250 µm or of at most 100 µm or of at most 50 µm. In particular, the interruption is so narrow that it is invisible to the naked human eye.

According to at least one embodiment of the light-emitting diode, the carrier comprises edges on the connection side. The edges in particular form boundary lines for the connection side. For example, the edges are each formed by portions of straight lines. In other words it is possible for each of the edges to extend along a straight line. The contact regions may be in each case in contact with the edges or be spaced from the edges.

According to at least one embodiment of the light-emitting diode, the contact regions and/or the dummy regions extend in each case along the edges. This means that the main directions of extension of the contact regions and/or of the dummy regions may be oriented parallel to the closest edge. In other words, the contact regions and/or the dummy regions may extend parallel to the respectively closest edge.

According to at least one embodiment of the light-emitting diode, the contact regions and/or the dummy regions are in each case planar. For example, a base area of the contact regions and dummy regions in each case amounts to at least 5 mm² or at least 10 mm² or at least 100 mm². The proportion of the total base area of the carrier occupied by the base area of the contact regions and/or of the dummy regions amounts, for example, in each case to at least 0.5% or at least 1% or at least 2%.

According to at least one embodiment of the light-emitting diode, at least one of the dummy regions or the plurality of dummy regions or all the dummy regions directly adjoin one of the edges. The dummy regions may thus be in contact with the edges, when viewed in plan view onto the connection side.

According to at least one embodiment of the light-emitting diode, at least one of the dummy regions or all of the dummy regions is/are each surrounded on precisely three sides or on precisely four sides by one of the contact regions. In other words the dummy region may adjoin the contact regions on three sides or on four sides, wherein preferably only the interruption is located, when viewed in plan view, between the dummy region and the contact region. Adjoin may here mean that a distance between the contact region and the dummy region amounts to at most 250 µm or at most 100 µm, parallel to the connection side.

According to at least one embodiment of the light-emitting diode, precisely one of the contact regions in each case extends along precisely one of the edges. In particular, each of the edges is assigned in a one-to-one relationship to precisely one of the contact regions. It is thus possible for each of the contact regions to be restricted to precisely one of the edges. Adjacent edges may here be separated from one another by a bend or by a change in direction of at least 15° or of at least 30° or of at least 45° or of at least 60°. For example, the carrier is then shaped as a regular octagon or as a regular hexagon.

According to at least one embodiment of the light-emitting diode, the contact regions and/or the dummy regions are located at at least two or at precisely two mutually opposing edges. For example, the contact regions and the dummy regions are located at four edges opposite one another in pairs.

According to at least one embodiment of the light-emitting diode, the latter comprises precisely one plane of mirror symmetry perpendicular to the connection side. The plane of mirror symmetry preferably extends through the center axis of the carrier. For example, the plane of mirror symmetry extends perpendicular to a longitudinal direction of the carrier. The longitudinal direction may be a direction which extends parallel to a longest one of the edges. Alternatively, it is possible for the plane of mirror symmetry to be oriented perpendicular to the longitudinal direction.

According to at least one embodiment of the light-emitting diode, the plane of mirror symmetry extends through two mutually opposing corners of the carrier. A diagonal of the connection side of the carrier may be encompassed by the plane of mirror symmetry.

The term plane of mirror symmetry here preferably relates to the carrier and the arrangement of contact regions and dummy regions and optionally also to the positioning of the active layer sequence. It is possible for further, in particular subordinate components of the light-emitting diode to be disregarded with regard to mirror symmetry.

According to at least one embodiment of the light-emitting diode, at least one or at least two or more than two of the dummy regions are located in each case at two or more than two of the edges. Along the edge in each case a subregion of one of the contact regions is located between the preferably at least two dummy regions. The dummy regions on the same edge are then preferably surrounded on at least three sides by the same contact region.

According to at least one embodiment of the light-emitting diode, the base area of at least one of the dummy regions or of all the dummy regions amounts to at least 5% or at least 10% or at least 20% and alternatively or additionally at most 50% or at most 40% or at most 30% of an area of the adjoining contact region. It is thus possible for the dummy regions to have a smaller area than the contact regions. The base area of the dummy regions is on the other hand preferably not negligibly small relative to the area of the contact regions, but rather is of the same order of magnitude.

According to at least one embodiment of the light-emitting diode, the latter in each case comprises at least two or precisely two of the first contact regions and at least two or precisely two of the second contact regions. The first contact regions are preferably mounted at mutually opposing edges of the connection side, as are the second contact regions. In other words, the two first contact regions are located opposite one another. Likewise, the two second contact regions are located opposite one another.

According to at least one embodiment of the light-emitting diode, the first contact regions and the second contact regions each extend along at least two or along precisely two of the edges of the connection side. In other words, at least four of the edges are then provided with contact regions. The carrier here preferably has a square or rectangular outline.

According to at least one embodiment of the light-emitting diode, the dummy regions and the contact regions are not distinguishable visually with the naked eye, in particular from a front of the carrier opposite the connection side. Alternatively or in addition, it is possible for the contact regions and the dummy regions also not to be visually distinguishable with the naked eye when viewed from the connection side. This is made possible in particular by the small average width of the interruption between the contact regions and the dummy regions and because the mirror layer is present in the same composition both in the contact regions and in the dummy regions. When viewed in particular from the front, the organic light-emitting diode then has a uniform appearance. The front may be that side of the light-emitting diode at which the light-emitting diode emits the most radiation when in operation.

Furthermore, an apparatus is provided which has at least one organic light-emitting diode as described in conjunction with one or more of the above-stated embodiments. Features of the apparatus are therefore also disclosed for the organic light-emitting diode and vice versa.

In at least one embodiment the apparatus comprises a holder. The holder contains at least two or at least four electrical contact pins. Each of the contact regions of the light-emitting diode is here directly connected electrically with one, with two or with more than two of the contact pins of the holder.

According to at least one embodiment of the apparatus, the contact pins comprise the same pattern of arrangement as the dummy regions of the associated light-emitting diode. If the light-emitting diode is mounted in incorrect orientation on the holder, preferably all the contact pins are connected only with the dummy regions and not with the contact regions of the light-emitting diode. As with the contact regions, the contact pins preferably cannot be congruently superimposed merely by rotation about the center axis of the carrier.

According to at least one embodiment, the contact pins of the holder are configured to contact the organic light-emitting diode electrically only on the connection side. The contact pins are in particular not visible from the front with the naked eye.

BRIEF DESCRIPTION OF THE DRAWINGS

A light-emitting diode described here and an apparatus described here will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

In the drawings:

FIGS. 1A-1B (collectively FIG. 1), 2A-2B (collectively FIG. 2), 3A-3B (collectively FIG. 3), and 4A-4B (collectively FIG. 4) show schematic plan views of exemplary embodiments of organic light-emitting diodes described here and of apparatuses described here.

DETAILED DESCRIPTION OF ILLUSTRATIVE EMBODIMENTS

FIGS. 1 to 4 each show schematic plan views of exemplary embodiments of organic light-emitting diodes 1 described here. The parts A of the figures (e.g., FIG. 1A) additionally each show an apparatus 10 with one of the light-emitting diodes 1 and with a holder, wherein the light-emitting diode 1 is properly and correctly mounted in the holder. The parts B of the figures (e.g., FIG. 1B), on the other hand, each show the light-emitting diode 1 mounted in incorrect orientation in the holder.

In all the exemplary embodiments the light-emitting diode 1 in each case comprises a carrier 2 with a connection side 20. At least one first electrical contact region 51 and at least one second electrical contact region 52 are located on the connection side. The contact regions 51, 52 extend along edges 22 on the connection side 20 of the carrier 2. Along the edges 22 electrical dummy regions 6 are located which are electrically insulated from the contact regions 51, 52. The dummy regions 6 are electrically insulated from the contact regions 51, 52. The dummy regions 6 are insulated from the contact regions 51, 52 preferably by track-like interruptions 7. The average width of the interruptions 7 is so small that they are imperceptible to the naked human eye.

An organic layer sequence 3 for generating radiation is mounted on the carrier 2, preferably on the connection side 20. The layer sequence 3 may be located between a mirror layer 4 and the carrier 2. The mirror layer 4 extends both onto the contact regions 51 and onto the dummy regions 6 and is divided in places by the interruptions 7. On a side of the mirror layer 4 remote from the carrier 2 a metallized contact layer may be applied in particular in the dummy regions 6 and/or in the contact regions 51, 52.

The light-emitting diodes 1 each display a plane of mirror symmetry M with regard to the carrier 2, the contact regions 51, 52, the electrical dummy regions 6 and the organic layer sequence 3 and the configuration of the mirror layer 4. The plane of mirror symmetry M is indicated in the figures in each case by a dash-dotted line. The plane of mirror symmetry M is oriented perpendicular to the connection side 20.

In addition, the light-emitting diodes 1 each comprise a center axis A. The center axis A is oriented perpendicular to the connection side 20 and extends through a geometric center point of the carrier 2, in particular through a point of intersection of diagonals of the carrier 2. The center axis A lies in the plane of mirror symmetry M.

The light-emitting diodes 1 optionally each comprise labels 9 on the contact regions 51, 52. The optional labels 9 show which of the contact regions 51, 52 is provided as anode and which as cathode. The labels 9 are preferably not visible from a front of the carrier 2 opposite the connection side 20.

In addition to the organic light-emitting diode 1, the apparatus 10 comprises a holder. In each of the figures, only contact pins 8a, 8b of the holder are symbolically represented. The contact pins 8a serve for anode contacting and the contact pins 8b for cathode contacting, symbolized by plus signs and minus signs.

In the exemplary embodiment according to FIG. 1A, the light-emitting diode 1 comprises precisely one first electrical contact region 51 and precisely one second electrical contact region 52. The contact regions 51, 52 extend along two mutually opposing edges 22 and extend parallel to a longitudinal direction L of the carrier 2.

Lateral dimensions of the light-emitting diodes 1 amount, for example, to between 5 cm×5 cm and 60 cm×60 cm inclusive. In particular, a dimension of the connection side 20 amounts to at least 10 cm×10 cm. Such dimensions may also apply to all the other exemplary embodiments.

Two dummy regions 6 are formed in each case along the opposing edges 22 with the contact regions 51, 52. The dummy regions 6 are arranged symmetrically with regard to the plane of mirror symmetry M, which extends parallel to the longitudinal direction L. The dummy regions 6 are not symmetrically arranged with regard to a plane perpendicular to the connection side 20 and perpendicular to the longitudinal direction L.

If the light-emitting diode 1 is connected correctly to the holder, the contact pins 8a of the holder are in direct contact with the first contact region 51 and contact pins 8b are in direct contact with the second contact region 52, see FIG. 1A.

FIG. 1B shows that the light-emitting diode 1 has been rotated in the holder by 180° about the center axis A, shown symbolically by a round circle about the center axis A. In the case of this incorrect, improper mounting of the light-emitting diode 1 in the holder, all the contact pins 8a, 8b are in contact with just the electrical dummy regions 6 and not with the contact regions 51, 52. In this way, the light-emitting diode 1 can be protected from incorrect electrical connection and the damage caused thereby.

Both the contact pins 8a, 8b and the dummy regions 6 are arranged in such a way that they cannot be congruently superimposed by geometric mapping in the form of rotation about the center axis A. The arrangement of the dummy regions 6 and of the contact pins 8a, 8b is thus not rotationally symmetrical with regard to the center axis A and in particular also with regard to an angle of rotation of 360° divided by the number of edges 22.

Such an arrangement of the dummy regions 6 and of the contact pins 8a, 8b can thus efficiently provide polarity reversal protection. Negative voltages on the anode side, which are typically harmful to the organic light-emitting diode 1, may be avoided. In the case in particular of current-driven operation with a clamping voltage which is above a damage threshold of the light-emitting diode 1, damage caused by polarity reversal is then avoidable.

In the exemplary embodiment according to FIG. 1, the dummy regions 6 at the edges 22 lie precisely opposite one another. In the exemplary embodiment according to FIG. 2, the dummy regions 6 are staggered relative to one another at the mutually opposing edges 22. The plane of mirror symmetry M extends perpendicular to the longitudinal direction L. Two of the dummy regions 6 at one of the edges 22 are located close to the plane of mirror symmetry M. The dummy regions 6 at the opposite edge 22 are located, on the other hand, close to the short sides of light-emitting diode 1, when viewed in plan view.

With this arrangement two of the dummy regions 6 and the contact pins 8a, 8b, when the light-emitting diode 1 is incorrectly mounted in the holder the contact pins 8a, 8b each face the dummy regions 6 and not the contact regions 51, 52, see FIG. 2B.

In FIGS. 1 and 2 the contact regions 51, 52 and the dummy regions 6 are each located at just precisely two of the edges 22 of the carrier 2. In the exemplary embodiments according to FIGS. 3 and 4 the contact regions 51, 52 and the dummy regions 6 are located at all four edges 22. The plane of mirror symmetry M extends in each case on a diagonal of the carrier 2. According to FIG. 3, two of the dummy regions 6 and two of the contact pins 8a, 8b and precisely one of the contact regions 51, 52 are provided on each edge 22. In the exemplary embodiment according to FIG. 4, in each case just one dummy region 6 and just one contact pin 8a, 8b is provided per edge 22 and per contact region 51, 52.

Regions at the corners 24 of the connection side 20 are optionally in each case free of contact regions 51, 52. The mirror layer 4 preferably also extends onto these regions at the corners 24.

Unlike in FIGS. 1 to 4, the carriers 2 may also have outlines other than square or rectangular. The carriers 2 may, for example, take the form in particular of regular triangles, hexagons or octagons.

Further components of the light-emitting diodes such as glass covers, mechanical mounts or sealing layers for the organic layer sequence are in each case not shown in the figures.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An organic light-emitting diode, comprising:
   a carrier with a connection side;
   an organic layer sequence with at least one active layer configured to generate radiation;
   a mirror layer on the connection side;
   a first electrical contact region and a second electrical contact region on the connection side for electrical contacting of the organic layer sequence; and
   a plurality of electrical dummy regions on the connection side, the dummy regions being electrically insulated from the contact regions;
   wherein the mirror layer is present both in the dummy regions and in the contact regions;
   wherein at least two of the dummy regions are arranged in such a way that base areas of these dummy regions cannot be congruently superimposed by arbitrary rotation of the carrier about a center axis of the carrier perpendicular to the connection side; and
   wherein a frame-like interruption in the mirror layer is located in each case between the dummy regions and the contact regions, wherein an average width of the interruption is at most 250 μm.

2. The organic light-emitting diode according to claim 1, wherein the contact regions and the dummy regions each extend along edges of the carrier on the connection side and are planar.

3. The organic light-emitting diode according to claim 2, wherein the dummy regions directly adjoin one of the edges and, when viewed in plan view onto the connection side, are each surrounded on three sides by one of the contact regions.

4. The organic light-emitting diode according to claim 2, wherein precisely one of the contact regions extends along precisely one of the edges and the contact regions and the dummy regions are located at at least two or at precisely two mutually opposing edges.

5. The organic light-emitting diode according to claim 1, comprising precisely one plane of mirror symmetry perpendicular to the connection side.

6. The organic light-emitting diode according to claim 5, wherein the plane of mirror symmetry extends parallel or perpendicular to a longitudinal direction of the carrier.

7. The organic light-emitting diode according to claim 5, wherein the plane of mirror symmetry extends through two mutually opposing corners of the carrier.

8. The organic light-emitting diode according to claim 2, wherein in each case at least two or more of the dummy regions are located at two or more of the edges.

9. The organic light-emitting diode according to claim 1, wherein the base area of at least one of the dummy regions amounts to between 10% and 40% inclusive of the area of the adjoining contact region.

10. The organic light-emitting diode according to claim 1, wherein the diode comprises at least two of the first contact regions and of the second contact regions.

11. The organic light-emitting diode according to claim 10, wherein the diode comprises precisely two first contact regions and precisely two second contact regions.

12. The organic light-emitting diode according to claim 10, wherein the first contact regions and the second contact regions each extend along at least two edges of the connection side.

13. The organic light-emitting diode according to claim 1, wherein the dummy regions and the contact regions are visually indistinguishable with the naked eye, when viewed from a front of the carrier opposite the connection side and/or from the connection side.

14. An apparatus comprising:
an organic light-emitting diode according to claim 1; and
a holder that comprises a plurality of electrical contact pins, wherein a contact region of the light-emitting diode is directly connected electrically with a contact pin of the holder.

15. An organic light-emitting diode, comprising:
a carrier with a connection side;
an organic layer sequence with at least one active layer configured to generate radiation;
a mirror layer on the connection side;
a first electrical contact region and a second electrical contact region in each case on the connection side for electrical contacting the organic layer sequence; and
a plurality of electrical dummy regions on the connection side the dummy regions being electrically insulated from the contact regions;
wherein the mirror layer is present both in the dummy regions and in the contact regions;
wherein at least two of the dummy regions are arranged in such a way that base areas of these dummy regions cannot be congruently superimposed merely by arbitrary rotation of the carrier about a center axis of the carrier perpendicular to the connection side;
wherein a frame-like interruption in the mirror layer is located in each case between the dummy regions and the contact regions, an average width of the interruption being at most 250 μm;
wherein the dummy regions and the contact regions are visually indistinguishable with the naked eye, when viewed from a front of the carrier opposite the connection side and/or from the connection side;
wherein the dummy regions are each surrounded on three sides or on four sides by one of the contact regions when seen in top view onto the connection side; and
wherein base areas of the dummy regions amount to between 5% and 10% inclusive of an area of the adjoining contact region.

16. An organic light-emitting diode, comprising:
a carrier with a connection side;
an organic layer sequence with at least one active layer configured to generate radiation;
a mirror layer on the connection side;
a first electrical contact region and a second electrical contact region on the connection side for electrical contacting of the organic layer sequence; and
a plurality of electrical dummy regions on the connection side, the dummy regions being electrically insulated from the contact regions;
wherein the mirror layer is present both in the dummy regions and in the contact regions;
wherein at least two of the dummy regions are arranged in such a way that base areas of these dummy regions cannot be congruently superimposed by arbitrary rotation of the carrier about a center axis of the carrier perpendicular to the connection side;
wherein the organic light-emitting diode comprises precisely one plane of mirror symmetry perpendicular to the connection side; and
wherein the plane of mirror symmetry extends through two mutually opposing corners of the carrier.

17. The organic light-emitting diode according to claim 16, wherein the contact regions and the dummy regions each extend along edges of the carrier on the connection side and are planar.

18. The organic light-emitting diode according to claim 16, wherein the base area of at least one of the dummy regions amounts to between 10% and 40% inclusive of the area of the adjoining contact region.

19. The organic light-emitting diode according to claim 16, wherein the diode comprises precisely two first contact regions and precisely two second contact regions.

20. The organic light-emitting diode according to claim 16, wherein the dummy regions and the contact regions are visually indistinguishable with the naked eye, when viewed from a front of the carrier opposite the connection side and/or from the connection side.

* * * * *